(12) United States Patent
Takeuchi et al.

(10) Patent No.: US 12,298,747 B2
(45) Date of Patent: May 13, 2025

(54) OPERATION STATE DISPLAY DEVICE AND OPERATION STATE DISPLAY METHOD FOR SETUP CHANGING IN BOARD MANUFACTURING

(71) Applicant: FUJI CORPORATION, Chiryu (JP)

(72) Inventors: Shinya Takeuchi, Toyoake (JP); Yusuke Kikuchi, Chiryu (JP); Shinichi Naka, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 388 days.

(21) Appl. No.: 17/779,304

(22) PCT Filed: Dec. 4, 2019

(86) PCT No.: PCT/JP2019/047457
§ 371 (c)(1),
(2) Date: May 24, 2022

(87) PCT Pub. No.: WO2021/111552
PCT Pub. Date: Jun. 10, 2021

(65) Prior Publication Data
US 2022/0404816 A1    Dec. 22, 2022

(51) Int. Cl.
G05B 19/418    (2006.01)
G06F 3/0484    (2022.01)
G06T 11/20    (2006.01)

(52) U.S. Cl.
CPC ..... *G05B 19/41865* (2013.01); *G06F 3/0484* (2013.01); *G06T 11/206* (2013.01); *G05B 2219/35312* (2013.01)

(58) Field of Classification Search
CPC .. H05K 13/085; H05K 13/0882; H05K 13/08; G05B 19/41865;
(Continued)

(56) References Cited

U.S. PATENT DOCUMENTS 10,139,812 B2 * 11/2018 Jones ................... G06F 3/0484
11,612,090 B2 * 3/2023 Shimizu ........... G05B 19/41865
(Continued)

FOREIGN PATENT DOCUMENTS

EP    3 451 093 A1    3/2019
JP    4335119 B2    9/2009
(Continued)

OTHER PUBLICATIONS

International Search Report issued Mar. 3, 2020 in PCT/JP2019/047457, filed on Dec. 4, 2019, citing document AO therein, 2 pages.

*Primary Examiner* — Darrin D Dunn
(74) *Attorney, Agent, or Firm* — Oblon, McClelland, Maier & Neustadt, L.L.P.

(57) ABSTRACT

An operation state display device displays an operation state of a board production facility in which a board is sequentially conveyed to multiple board work machines, which perform predetermined board work on the board, and the board work is sequentially performed to produce a board product, and includes an acquisition section and a display section. The acquisition section acquires an execution time zone in which setup changing work required for switching a type of the board product to be produced is performed, for each board work machine, based on production information acquired by the board production facility during production of the board product. The display section graphically displays at least one of the execution time zone for each of the multiple board work machines and the execution time zone for a predetermined board work machine of the board production facility in time series.

7 Claims, 5 Drawing Sheets

(58) Field of Classification Search
CPC .... G05B 2219/45026; G05B 19/41805; G05B 19/4188; G05B 19/418; G05B 19/41875; G05B 2219/24015; G05B 2219/31411; G05B 2219/32015; G05B 2219/32247; G05B 19/4189; G05B 2219/32016; G05B 2219/32019

See application file for complete search history.

(56) References Cited

U.S. PATENT DOCUMENTS

| | | | |
|---|---|---|---|
| 2002/0124394 A1 | 9/2002 | Slechta et al. | |
| 2004/0153868 A1* | 8/2004 | Nonaka | H05K 13/0465 |
| | | | 714/47.2 |
| 2015/0039115 A1* | 2/2015 | Sagara | G05B 19/41865 |
| | | | 700/106 |
| 2018/0113444 A1* | 4/2018 | Harada | G05B 19/41865 |
| 2021/0153402 A1* | 5/2021 | Yamashita | H05K 13/0419 |
| 2022/0087087 A1* | 3/2022 | Minoshima | H05K 13/0857 |
| 2022/0117126 A1* | 4/2022 | Fukao | H05K 13/0882 |
| 2022/0180580 A1* | 6/2022 | Yokoyama | H05K 13/0882 |
| 2023/0389251 A1* | 11/2023 | Sanji | H05K 13/0812 |

FOREIGN PATENT DOCUMENTS

| | | |
|---|---|---|
| JP | 5276291 B2 | 8/2013 |
| WO | WO 2018/198246 A1 | 11/2018 |

\* cited by examiner

OPERATION STATE DISPLAY DEVICE AND OPERATION STATE DISPLAY METHOD FOR SETUP CHANGING IN BOARD MANUFACTURING

TECHNICAL FIELD

The present description discloses a technique relating to an operation state display device and an operation state display method.

BACKGROUND ART

An operation state display system disclosed in Patent Literature 1 includes a display device capable of displaying a processing time of a workpiece in each of multiple lanes on a screen in time series for each processing unit. The display device displays, on the screen, a processing unit axis and a time axis on which the processing units are listed in an arrangement order, and displays event information including at least one of a processing start time and a processing completion time of the workpiece in the processing unit in association with each of the processing unit and the multiple lanes along the time axis. The event information includes the processing start time and the processing completion time of the workpiece in each of the multiple lanes for each processing unit, and a status of the processing unit. The status includes at least one of production, waiting for a post-process, waiting for a component supply, and waiting for a preceding-process.

PATENT LITERATURE

Patent Literature 1: Japanese Patent No. 5276291

BRIEF SUMMARY

Technical Problem

In a board production facility, setup changing work is performed in a case where a type of board product to be produced is switched. The increase in the number of steps of the setup changing work is a factor that reduces an operating ratio of the board production facility, and there is a demand for visualization of an execution time zone in which the setup changing work is performed.

In view of such a circumstance, the present description discloses an operation state display device and an operation state display method capable of graphically displaying, in time series, an execution time zone in which setup changing work of a board production facility in which a board product is produced is performed.

Solution to Problem

The present description discloses an operation state display device configured to display an operation state of a board production facility in which a board is sequentially conveyed to multiple board work machines, which are configured to perform predetermined board work on the board, and the board work is sequentially performed to produce a board product and including an acquisition section and a display section. The acquisition section is configured to acquire an execution time zone in which setup changing work required for switching a type of the board product to be produced is performed, for each board work machine, based on production information acquired by the board production facility during production of the board product. The display section is configured to graphically display at least one of the execution time zone for each of the multiple board work machines and the execution time zone for a predetermined board work machine of the board production facility in time series.

In addition, the present description discloses an operation state display method of displaying an operation state of a board production facility in which a board is sequentially conveyed to multiple board work machines, which are configured to perform predetermined board work on the board, and the board work is sequentially performed to produce a board product and including an acquisition step and a display step. In the acquisition step, an execution time zone in which setup changing work required for switching a type of the board product to be produced is performed is acquired, for each board work machine, based on production information acquired by the board production facility during production of the board product. In the display step, at least one of the execution time zone for each of the multiple board work machines and the execution time zone for a predetermined board work machine of the board production facility is graphically displayed in time series.

Advantageous Effects

The operation state display device described above includes the acquisition section and the display section. Therefore, the operation state display device described above can graphically display the execution time zone in which the setup changing work of the board production facility in which the board product is produced is performed in time series. The above description of the operation state display device can be similarly applied to an operation state display method.

DESCRIPTION OF EMBODIMENTS

1. Embodiment

1-1. Configuration Example of Board Production Facility PF0

Figure 1:
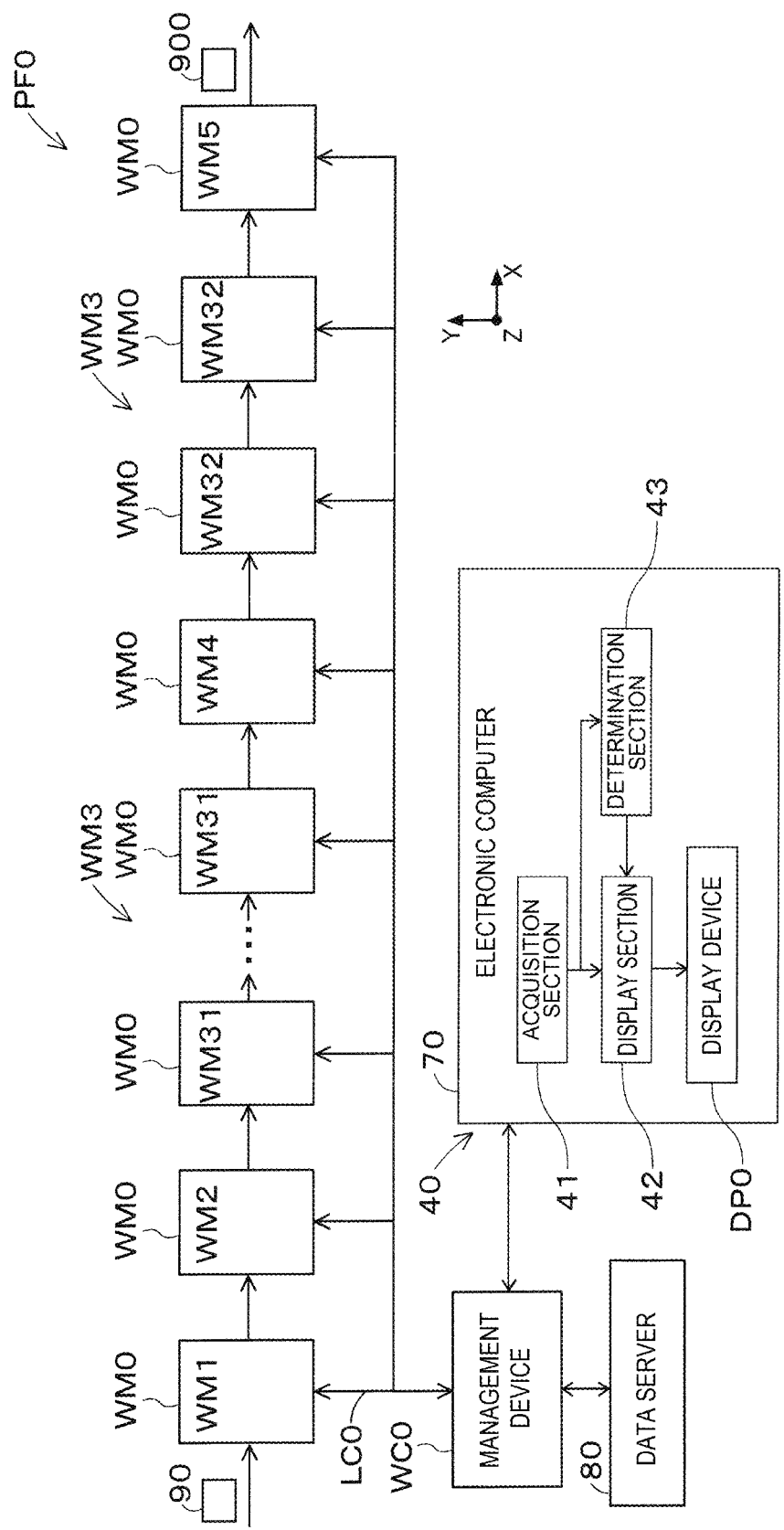
FIG. 1 is a configuration diagram showing a configuration example of a board production facility.

Board production facility PF0 produces board product 900 by using board work machine WM0 that performs predetermined board work on board 90. The type and number of board work machines WM0 are not limited. As shown in FIG. 1, board production facility PF0 according to the present embodiment includes multiple types (five types) of board work machines WM0 of printer WM1, printing inspector WM2, component mounter WM3, appearance inspector WM4, and reflow furnace WM5.

In board production facility PF0, board 90 is sequentially conveyed in multiple board work machines WM0 and the board work is sequentially performed to produce board product 900. Specifically, board 90 is carried in from printer WM1 on the upstream side shown in FIG. 1. A board conveyance device sequentially conveys board 90 in multiple board work machines WM0, and predetermined board work is sequentially performed by board work machine WM0. Moreover, board 90 is carried out from reflow furnace WM5 on the downstream side.

Printer WM1 prints solder on board 90 at a mounting position of each of multiple components 91. Printing inspector WM2 inspects a printing state of the solder which is printed by printer WM1. Component mounter WM3 mounts multiple components 91 on board 90 on which the solder is printed. One or multiple component mounters WM3 may be provided. In a case where multiple component mounters WM3 are provided, multiple component mounters WM3 can be shared to mount multiple components 91.

Component mounter WM3 according to the present embodiment includes multiple (eight) first component mounters WM31 and multiple (two) second component mounters WM32. First component mounter WM31 is provided on the upstream side of appearance inspector WM4, and performs a mounting process of a first stage. Second component mounter WM32 is provided on the downstream side of appearance inspector WM4, and performs the mounting process of a second stage. For example, first component mounter WM31 mounts a small component, and second component mounter WM32 mounts a large component having a higher height than the small component across the mounted small component. In addition, first component mounter WM31 can mount a shield target component, and second component mounter WM32 can mount a shield component to cover the mounted shield target component. As described above, component mounter WM3 according to the present embodiment can also mount multiple components 91 to the same mounting position of board 90.

Appearance inspector WM4 inspects a mounting state of multiple components 91 mounted by component mounter WM3. Appearance inspector WM4 according to the present embodiment inspects the mounting state of component 91 mounted by first component mounter WM31. Although appearance inspector WM4 can be further provided on the downstream side of second component mounter WM32, in the present embodiment, the mounting state of component 91 mounted by second component mounter WM32 is inspected by second component mounter WM32. It should be noted that appearance inspector WM4 can be further provided on the downstream side of reflow furnace WM5.

Reflow furnace WM5 heats board 90 on which multiple components 91 are mounted by component mounter WM3, melts the solder, and performs soldering. In this way, board production facility PF0 can use multiple board work machines WM0 to sequentially convey board 90 and perform a production process including an inspection process to produce board product 900. It should be noted that board production facility PF0 can also include, as needed, board work machines WM0, such as a function inspector, a buffer device, a board supply device, a board flipping device, an adhesive application device, and an ultraviolet irradiation device.

Multiple board work machines WM0 and management device WC0 constituting board production facility PF0 are communicably connected by wired or wireless communication section LC0. In addition, various methods can be adopted as a communication method. In the present embodiment, a local area network (LAN) is composed of multiple board work machines WM0 and management device WC0. As a result, multiple board work machines WM0 can communicate with each other via communication section LC0. In addition, multiple board work machines WM0 can communicate with management device WC0 via communication section LC0.

Management device WC0 controls multiple board work machines WM0 constituting board production facility PF0, and monitors an operating status of board production facility PF0. Management device WC0 stores various control data for controlling multiple board work machines WM0. Management device WC0 transmits the control data to each of multiple board work machines WM0. In addition, each of multiple board work machines WM0 transmits the operating status and a production status to management device WC0.

Management device WC0 can be provided with data server 80. Data server 80 can store, for example, the acquisition data acquired by board work machine WM0 in the board work. Various image data captured by board work machine WM0 are included in the acquisition data. Record (log data) of an operation state acquired by board work machine WM0 is included in the acquisition data.

1-2. Configuration Example of Component Mounter WM3

Figure 2:
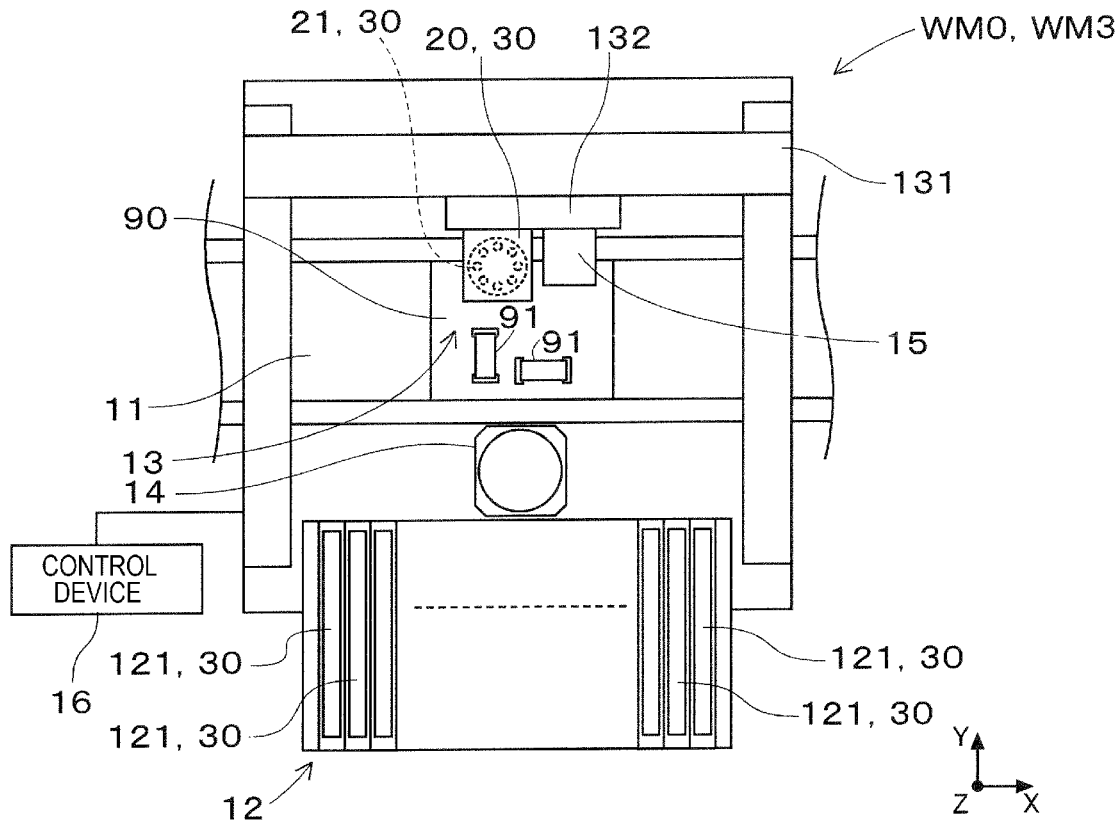
FIG. 2 is a plan view showing a configuration example of a component mounter.

Component mounter WM3 mounts multiple components 91 on board 90. As shown in FIG. 2, component mounter WM3 includes board conveyance device 11, component supply device 12, component transfer device 13, part camera 14, board camera 15, and control device 16. In the present description, a conveyance direction of board 90 is indicated as an X-axis direction. A direction orthogonal to the X-axis direction in a horizontal plane is indicated as a Y-axis direction. The directions orthogonal to the X-axis direction and the Y-axis direction are indicated as a Z-axis direction.

Board conveyance device 11 is, for example, composed of a belt conveyor, and conveys board 90 in the conveyance direction (X-axis direction). Board conveyance device 11 carries board 90 in component mounter WM3, and positions board 90 at a predetermined position inside the machine. After a mounting process of multiple components 91 by component mounter WM3 ends, board conveyance device 11 carries board 90 out of component mounter WM3.

Component supply device 12 supplies multiple components 91 to be mounted on board 90. Component supply device 12 includes multiple feeders 121 that are provided along the conveyance direction of board 90 (X-axis direction). Each of multiple feeders 121 performs pitch-feeding of a carrier tape, in which multiple components 91 are accommodated, and supplies components 91 to be picked up at a supply position located on the distal end side of feeder 121. In addition, component supply device 12 can supply a relatively large electronic component (lead component) as compared with a chip component or the like in a state of being disposed on a tray.

Component transfer device 13 includes head driving device 131 and moving body 132. Head driving device 131 is configured to move moving body 132 in the X-axis direction and the Y-axis direction by a linear motion mechanism. Mounting head 20 is detachably (exchangeably) provided on moving body 132 by a clamp member. Mounting head 20 uses at least one holding member 21 to pick up and hold component 91 supplied by component supply device 12, and mounts component 91 to board 90 positioned by board conveyance device 11. As holding member 21, for example, a suction nozzle or a chuck can be used.

As part camera 14 and board camera 15, a known imaging device can be used. Part camera 14 is fixed to a base of component mounter WM3 such that an optical axis thereof is directed upward (vertically upward) in the Z-axis direction. Part camera 14 can image component 91 held by holding member 21 from below. Board camera 15 is provided in moving body 132 of component transfer device 13 such that an optical axis thereof is directed downward in the Z-axis direction (vertically downward). Board camera 15 can image board 90 from above. Part camera 14 and board camera 15 perform imaging based on control signals transmitted from control device 16. The image data captured by part camera 14 and board camera 15 are transmitted to control device 16.

Control device 16 includes a known arithmetic device and a storage device, and constitutes a control circuit. The information, image data, and the like output from various sensors provided in component mounter WM3 are input to control device 16. Control device 16 transmits the control signals to each device based on a control program, a predetermined mounting condition, which is set in advance, and the like.

For example, control device 16 causes board camera 15 to image board 90 which is positioned by board conveyance device 11. Control device 16 performs image processing on the image captured by board camera 15 to recognize a positioning state of board 90. In addition, control device 16 causes holding member 21 to pick up and hold component 91 supplied by component supply device 12 and causes part camera 14 to image component 91 held by holding member 21. Control device 16 performs the image processing on the image captured by part camera 14 to recognize the appropriateness of component 91 and a holding posture of component 91.

Control device 16 moves holding member 21 toward above a scheduled mounting position, which is set in advance by the control program or the like. In addition, based on the positioning state of board 90, the holding posture of component 91, and the like, control device 16 corrects the scheduled mounting position to set the mounting position on which component 91 is actually mounted. The scheduled mounting position and the mounting position include a rotation angle in addition to the position (X coordinate and Y coordinate).

Control device 16 corrects a target position (X coordinate and Y coordinate) and the rotation angle of holding member 21 in accordance with the mounting position. Control device 16 lowers holding member 21 at the corrected rotation angle at the corrected target position, and mounts component 91 on board 90. Control device 16 repeats a pick-and-place cycle to perform the mounting process of mounting multiple components 91 on board 90.

1-3. Configuration Example of Operation State Display Device 40

Operation state display device 40 displays an operation state of board production facility PF0. Operation state display device 40 can be provided in various electronic computers, control devices, and the like. As shown in FIG. 1, operation state display device 40 according to the present embodiment is provided in electronic computer 70. Electronic computer 70 includes a known arithmetic device, storage device, input device, and output device (including display device DP0). Operation state display device 40 can also be formed, for example, on board work machine WM0, management device WC0, a host computer that manages multiple board production facilities PF0, and a cloud.

In addition, operation state display device 40 includes acquisition section 41 and display section 42 when regarded as a control block. Operation state display device 40 can also include determination section 43. As shown in FIG. 1, operation state display device 40 according to the present embodiment includes acquisition section 41, display section 42, and determination section 43. Further, operation state display device 40 executes control in accordance with a flowchart shown in FIG. 3. Acquisition section 41 performs a process shown in step S11. Display section 42 performs a process shown in step S13. Determination section 43 performs a process shown in step S12.

1-3-1. Acquisition Section 41

Figure 3:
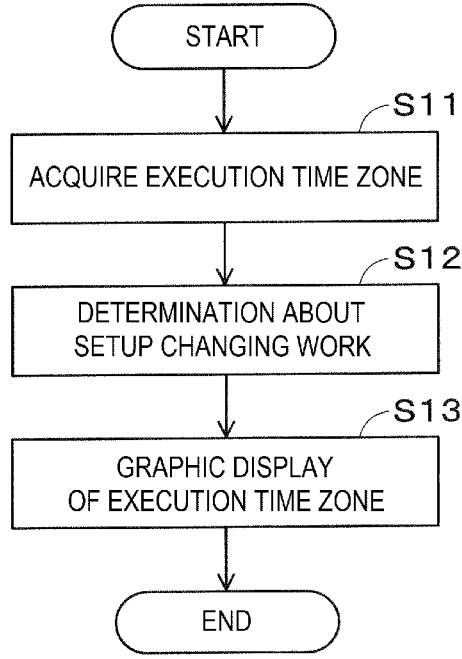
FIG. 3 is a flowchart showing an example of a control procedure of an operation state display device.

Based on production information acquired by board production facility PF0 during the production of board product 900, acquisition section 41 acquires, for each board work machine WM0, execution time zone TP0 in which the setup changing work required for switching the type of board product 900 to be produced (step S11 shown in FIG. 3).

Information relating to the operation state acquired by board work machine WM0 during the production of board product 900 is included in the production information. Acquisition section 41 can acquire execution time zone TP0 from, for example, the record (log data) of the operation state acquired by board work machine WM0. As described above, the log data is stored in data server 80 shown in FIG. 1. Acquisition section 41 according to the present embodiment acquires the log data from data server 80 and acquires execution time zone TP0. For example, the time when board 90 is carried in and carried out from board work machine WM0 is information relating to the operation state of board work machine WM0, and is included in the production information and recorded in the log data.

Here, the production before the type of board product 900 is switched is defined as first production, and the production after the type of board product 900 is switched is defined as second production. In a case where board work machine WM0 carries out last board 90 of board product 900 produced in the first production, board work machine WM0 can start the setup changing work for performing the second production. In addition, in a case where a predetermined number of initial boards 90 of board product 900 to be produced in the second production are carried in or carried out to board work machine WM0, it can be said that the setup changing work for performing the second production ends in board work machine WM0.

Accordingly, acquisition section 41 acquires, as execution time zone TP0, a time zone from the time when last board 90 of board product 900 produced in the first production is carried out to the time when the predetermined number of initial boards 90 of board product 900 produced in the second production are carried in or carried out. The predetermined number may be one sheet or multiple sheets. For example, a producer of board product 900 may perform trial production of board product 900 in the setup changing work.

In this case, the predetermined number is set in accordance with the number of boards 90 on which the trial production is performed. In a case where the trial production of board product 900 is not performed in the setup changing work, the predetermined number is set to one sheet.

In addition, the producer of board product 900 may consider that the setup changing work for performing the second production ends in a case where the predetermined number of initial boards 90 of board product 900 to be produced in the second production are carried in. In this case, acquisition section 41 acquires, as execution time zone TP0, the time zone from the time when last board 90 of board product 900 produced in the first production is carried out to the time when the predetermined number of initial boards 90 of board product 900 produced in the second production are carried in.

On the other hand, the producer of board product 900 may also consider that the setup changing work for performing the second production ends in a case where the predetermined number of initial boards 90 of board product 900 to be produced in the second production are carried out. In this case, acquisition section 41 acquires, as execution time zone TP0, the time zone from the time when last board 90 of board product 900 produced in the first production is carried out to the time when the predetermined number of initial boards 90 of board product 900 produced in the second production are carried out.

It should be noted that the definitions of the presence or absence of the trial production of board product 900 and the end of the setup changing work are information relating to the operation state of board work machine WM0, and are included in the production information and recorded in the log data. In addition, the information relating to the first production and the second production (including a switching timing) is information relating to the operation state of board work machine WM0, and is included in the production information and recorded in the log data.

1-3-2. Display Section 42

Display section 42 graphically displays at least one of execution time zone TP0 for each of multiple board work machines WM0 and execution time zone TP0 for predetermined board work machine WM0 of board production facility PF0 in time series (step S13 shown in FIG. 3).

Display section 42 can execute the graphical display for, for example, display device DP0 shown in FIG. 1. As display device DP0, a known display device, such as a liquid crystal display device, can be used. Display device DP0 graphically displays execution time zone TP0 in time series. In addition, a display format of the graph display is not limited, and display section 42 can graphically display execution time zone TP0 in various display formats.

Figure 4:
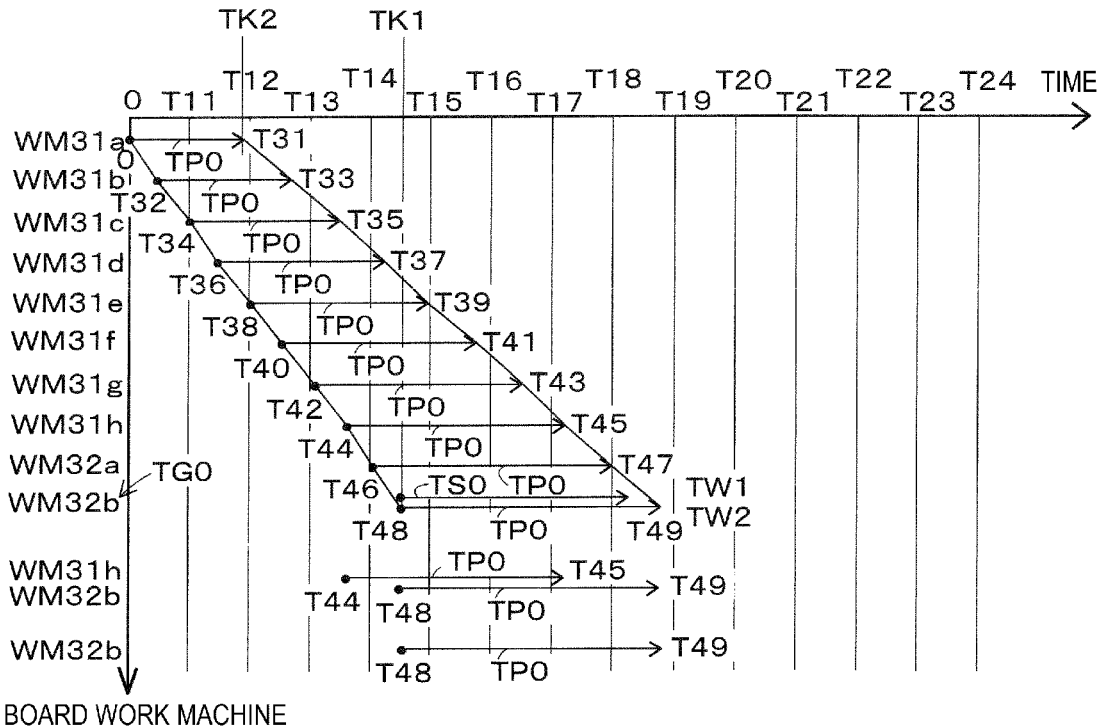
FIG. 4 is a schematic diagram showing an example of a graph display by a display section.

FIG. 4 shows an example of a graph display by display section 42. In FIG. 4, execution time zone TP0 for each of multiple (ten) component mounters WM3 is graphically displayed in time series. Specifically, in FIG. 4, execution time zone TP0 for each of multiple (eight) first component mounters WM31 is graphically displayed in time series, and execution time zone TP0 for each of multiple (two) second component mounters WM32 is graphically displayed in time series.

It should be noted that, in FIG. 4, for convenience of illustration, reference numerals are assigned in a conveyance order of board 90 from first component mounter WM31a on the most upstream side to first component mounter WM31h on the most downstream side. Similarly, in FIG. 4, for convenience of illustration, reference numerals are assigned in the conveyance order of board 90 from second component mounter WM32a on the most upstream side to second component mounter WM32b on the most downstream side.

In addition, in FIG. 4, execution time zone TP0 for predetermined board work machine WM0 of board production facility PF0 (for example, first component mounter WM31h and second component mounter WM32b) is graphically displayed in time series. First component mounter WM31h is first component mounter WM31 on the rearmost side (most downstream side) among multiple (eight) first component mounters WM31, and second component mounter WM32b is second component mounter WM32 on the rearmost side (most downstream side) among multiple (two) second component mounters WM32.

Further, in FIG. 4, execution time zone TP0 for predetermined board work machine WM0 of board production facility PF0 (for example, second component mounter WM32b) is graphically displayed in time series. Second component mounter WM32b is component mounter WM3 on the rearmost side (most downstream side) among multiple (ten) component mounters WM3. It should be noted that display section 42 can display any first component mounter WM31 and any second component mounter WM32. In addition, in FIG. 4, a horizontal axis represents a time, and a vertical axis represents a reference numeral of board work machine WM0 (component mounter WM3) described above.

Times T11 to T24 on the horizontal axis in FIG. 4 represent times at certain time starting from a reference time (time 0). The certain time can be optionally set within a range capable of grasping the trend of execution time zone TP0. The certain time can be set, for example, based on a required time for the attachment or detachment work of one article 30. For example, in a case where the required time is 1 minute, the certain time can be set to, for example, several minutes (for example, about 2 minutes to 5 minutes).

In addition, the reference numerals of board work machine WM0 (component mounter WM3) on the vertical axis in FIG. 4 are listed in the order described above from board work machine WM0 (component mounter WM3) on the upstream side to board work machine WM0 (component mounter WM3) on the downstream side. Further, time 0 and times T31 to T49 displayed at both end portions of the arrow of execution time zone TP0 indicate a start time or an end time of the setup changing work.

Since board 90 is sequentially conveyed from first component mounter WM31a, which is component mounter WM3 on the most upstream side, to second component mounter WM32b, which is component mounter WM3 on the most downstream side, the first production in first component mounter WM31a ends the earliest, and the setup changing work is started the earliest. Moreover, in first component mounter WM31a, the setup changing work ends the earliest, and the second production is started the earliest.

In component mounter WM3 on the downstream side of first component mounter WM31a, the first production sequentially ends, the setup changing work is started, the setup changing work ends, and the second production is started. Therefore, in second component mounter WM32b, the first production ends the latest, and the setup changing work is started the latest. Moreover, in second component mounter WM32b, the setup changing work ends the latest, and the second production is started the latest.

As shown by the graph display of execution time zone TP0 for each of multiple (ten) component mounters WM3 in FIG. 4, the required time for the setup changing work indicated by execution time zone TP0 is increased at a substantially fixed rate from first component mounter WM31a on the most upstream side to second component mounter WM32b on the most downstream side. In this case, a user of operation state display device 40 can visually recognize that the setup changing work is performed smoothly.

Figure 5:
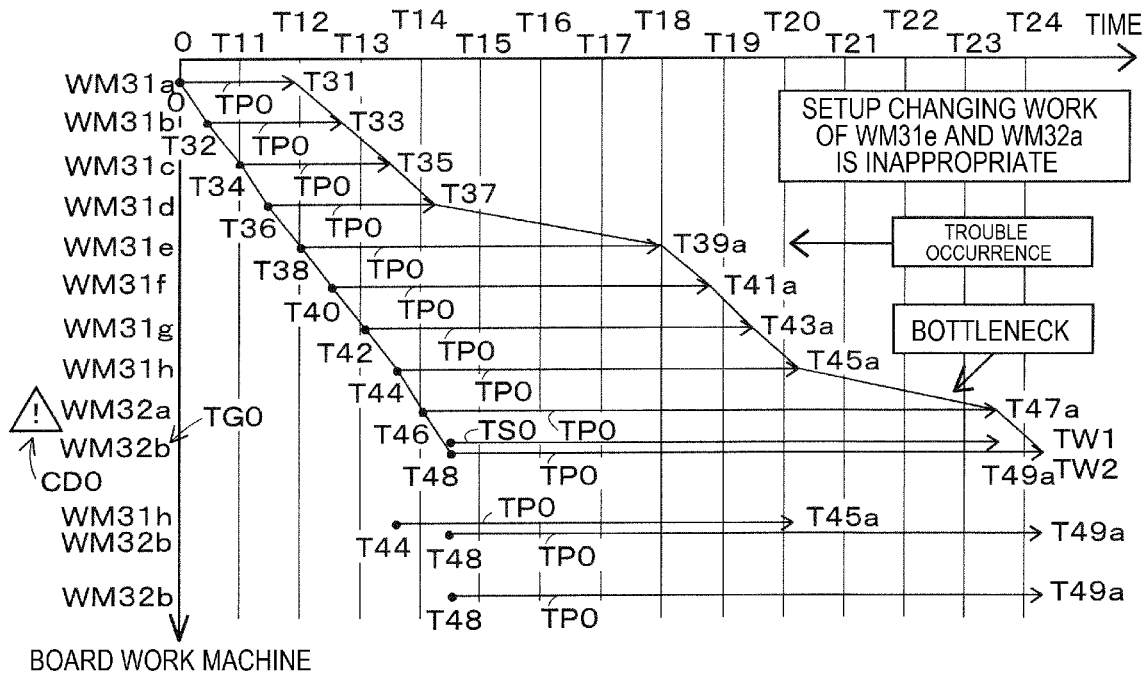
FIG. 5 is a schematic diagram showing another example of the graph display by the display section.

FIG. 5 shows another example of the graph display by display section 42. FIG. 5 is shown in the same manner as FIG. 4. It should be noted that, in FIG. 5, time T39 displayed at a distal end portion of the arrow indicating execution time zone TP0 is indicated by time T39a, and time T41 is indicated by time T41a. Similarly, time T43 is indicated by time T43a, and time T45 is indicated by time T45a. Time T47 is indicated by time T47a, and time T49 is indicated by time T49a.

As shown by the graphical display of execution time zone TP0 for each of multiple (ten) component mounters WM3 in FIG. 5, time T39a is later than time T39 shown in FIG. 4. That is, the required time for the setup changing work in first component mounter WM31e is increased as compared with a case of FIG. 4. The above description of first component mounter WM31e can be similarly applied to component mounter WM3 on the downstream side of first component mounter WM31e.

In addition, an increase ratio of the required time for the setup changing work of second component mounter WM32a to first component mounter WM31h is rapidly increased as compared with component mounter WM3 from first component mounter WM31e to first component mounter WM31h. In this case, the user of operation state display device 40 can visually recognize that there is a problem in the setup changing work in first component mounter WM31e and second component mounter WM32a.

Display section 42 can display specific information together with execution time zone TP0. The specific information is information relating to at least one of switching timing TM1 of the production program, attachment or detachment timing TM2 of article 30 attached to or detached from board work machine WM0, collation timing TM3 of article 30, first time zone TZ1, second time zone TZ2, and trial production time zone TZ3, and is included in the production information.

The production program is a production program driving and controlling board work machine WM0, and is defined by a production plan of board product 900. Switching timing TM1 of the production program refers to a timing at which the production program used in the first production is switched to the production program used in the second production. The switching of the production program can be performed by management device WC0 that manages board work machine WM0, or can be performed by an operator.

Article 30 need only be an article that is attached to or detached from board work machine WM0 in the setup changing work, and is not limited. For example, in a case where board work machine WM0 is component mounter WM3, feeder 121, mounting head 20, and holding member 21 shown in FIG. 2 are provided in article 30. In addition, a reel on which a carrier tape for accommodating component 91 is wound and a component tray for accommodating component 91 are provided in article 30. Further, for example, in a case where board work machine WM0 is printer WM1, the mask, the squeegee, and the dispense head are provided in article 30.

The attachment or detachment work of article 30 can be performed by the operator or an exchange device that exchanges article 30. For example, it is assumed that the operator exchanges feeder 121 shown in FIG. 2. In this case, in a case where feeder 121 is mounted on the slot, the operator reads an identification code attached to feeder 121 by using a reading device, and mounts feeder 121 in a predetermined slot of component supply device 12.

In a case where feeder 121 is mounted on the slot, electric power is supplied from component mounter WM3 via a connector, and feeder 121 is in a state of being able to communicate with component mounter WM3. As a result, the slot of component supply device 12 is associated with identification information of feeder 121 mounted on the slot, and attachment information indicating that feeder 121 is mounted is recorded. On the contrary, in a case where feeder 121 is detached from the slot, component mounter WM3 cannot communicate with feeder 121. As a result, detachment information indicating that feeder 121 is detached is recorded.

Acquisition section 41 acquires, as detachment timing TM21 of feeder 121, the time when feeder 121 is detached, which is included in the detachment information of feeder 121 detached by the attachment or detachment work. Similarly, acquisition section 41 acquires, as attachment timing TM22 of feeder 121, the time when feeder 121 is mounted, which is included in the attachment information of feeder 121 mounted by the attachment or detachment work.

As described above, attachment or detachment timing TM2 of feeder 121 includes detachment timing TM21 and attachment timing TM22. It should be noted that the above description of feeder 121 can be similarly applied to another article 30 described above. In addition, attachment or detachment timing TM2 of article 30 can also be acquired using, for example, a detection signal of a detector that detects the attachment or detachment of article 30.

Further, in a case where the attachment or detachment work of multiple articles 30 is performed in one board work machine WM0, attachment or detachment timing TM2 may include at least detachment timing TM21 of article 30 on which the attachment or detachment work is first performed, and attachment timing TM22 of article 30 on which the attachment or detachment work is finally performed. In this case, in a case where the attachment or detachment work in which at least one of the required time and the work interval of the attachment or detachment work is equal to or larger than a predetermined threshold value is included, attachment or detachment timing TM2 may further include detachment timing TM21 of article 30 on which the attachment or detachment work is performed, and attachment timing TM22 of article 30 on which the attachment or detachment work is performed. In addition, in the attachment or detachment work, multiple articles 30 can be attached or detached simultaneously.

Collation timing TM3 of article 30 refers to a timing at which the correctness of article 30 mounted on board work machine WM0 is determined. Article 30 to be mounted on board work machine WM0 is defined by the production plan of board product 900. Board work machine WM0 determines that correct article 30 is mounted in a case where article 30 mounted in board work machine WM0 is article 30 defined in the production plan of board product 900.

Conversely, board work machine WM0 determines that wrong article 30 is mounted in a case where article 30 mounted in board work machine WM0 is different from article 30 defined in the production plan of board product 900. Acquisition section 41 acquires, as collation timing TM3 of article 30, the time when it is determined that correct article 30 is mounted for all articles 30 to be attached or detached in the attachment or detachment work. In addition, acquisition section 41 can acquire, as collation timing TM3 of article 30, the time when it is determined that wrong article 30 is mounted.

First time zone TZ1 refers to a time zone from when the collation of article 30 is completed to the time when board 90 is carried in board work machine WM0. Acquisition section 41 acquires, as first time zone TZ1, the time zone from the time when it is determined that correct article 30 is mounted in all articles 30 to be attached or detached in the attachment or detachment work to the time when board 90 is carried in board work machine WM0. In addition, second time zone TZ2 refers to a time zone from the time when board work machine WM0 is stopped due to a failure of the setup changing work to the time when board work machine WM0 is operatable.

For example, board work machine WM0 may be stopped due to an abnormality of article 30 mounted on board work machine WM0 by the attachment or detachment work, an abnormality of a device constituting board work machine WM0 after the attachment or detachment work, or the like. In this case, the operator removes the factor of the stoppage of board work machine WM0 to restore board work machine WM0. Acquisition section 41 acquires, as second time zone TZ2, the time zone from the time when board work machine WM0 is stopped to the time when board work machine WM0 is restored and is operable.

Further, trial production time zone TZ3 refers to a time zone in which the trial production of board product 900 is performed in the setup changing work. Acquisition section 41 acquires, as trial production time zone TZ3, the time zone from the start time when the trial production of board product 900 is started to the end time when the trial production of board product 900 ends.

Display section 42 can display specific information together with execution time zone TP0, for example, in the graphical display shown in FIG. 4 or FIG. 5. In this case, for example, display section 42 may change a display color for each type of the specific information to display execution time zone TP0 and the specific information to be distinguishable from each other. It should be noted that the visibility of the user of operation state display device 40 is lower as the number of board work machines WM0 to be displayed is larger. Similarly, the visibility of the user of operation state display device 40 is lower as the number of types of specific information to be displayed is larger.

Figure 6:
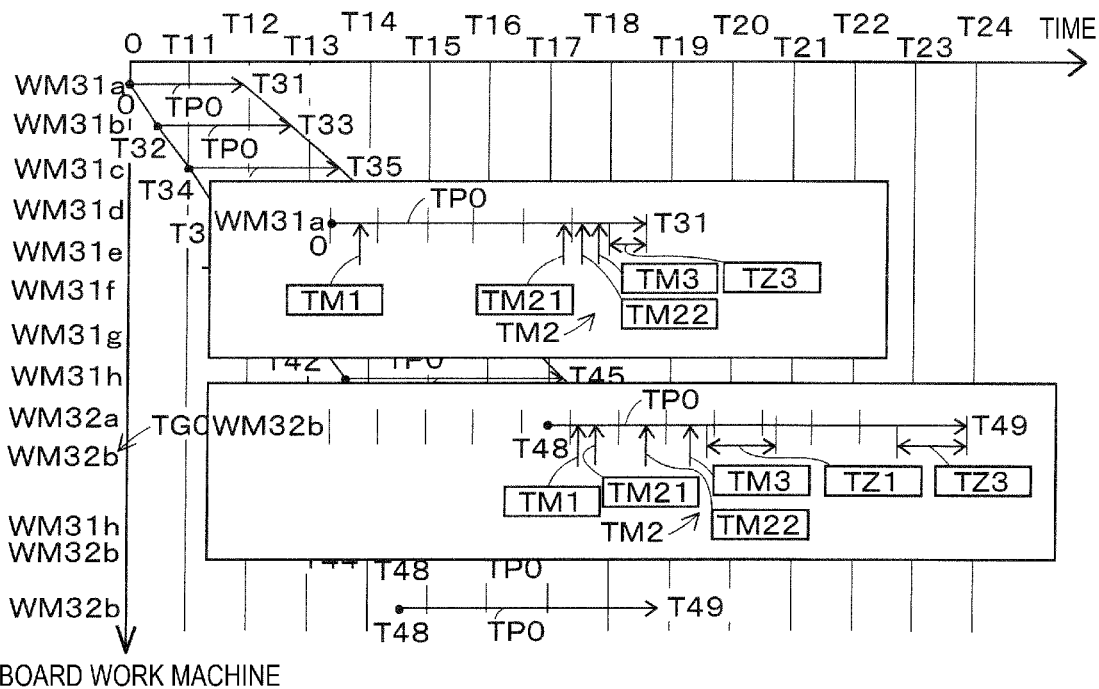
FIG. 6 is a schematic diagram showing an example of a pop-up display of FIG. 4.
Figure 7:
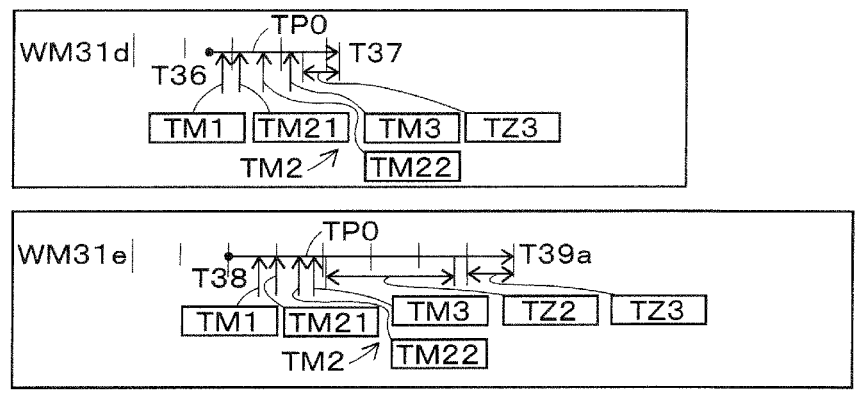
FIG. 7 is a schematic diagram showing an example of a pop-up display of FIG. 5.
Figure 8:
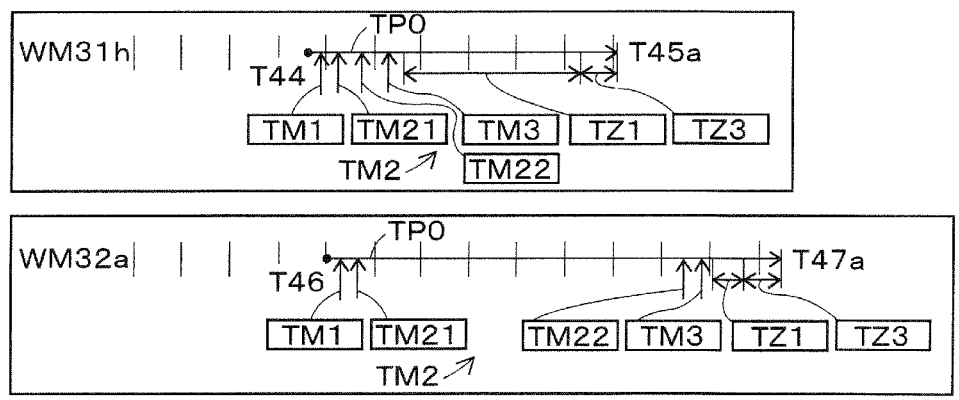
FIG. 8 is a schematic diagram showing another example of the pop-up display of FIG. 5.

Therefore, display section 42 may execute pop-up display of predetermined execution time zone TP0 selected by the user and the specific information relating to execution time zone TP0. FIG. 6 shows an example of the pop-up display of the graphical display of FIG. 4. In addition, FIG. 7 shows an example of the pop-up display of the graph display in FIG. 5, and FIG. 8 shows another example of the pop-up display of the graph display in FIG. 5. As shown in FIG. 6, display section 42 can display, for example, predetermined execution time zone TP0 and the specific information relating to execution time zone TP0 on a front surface of the graph display shown in FIG. 4. It should be noted that, in the pop-up display shown in FIGS. 7 and 8, the graphical display shown in FIG. 5 on a rear surface is omitted.

For example, electronic computer 70 includes a mouse (input device). In a case where the user moves the mouse, a mouse pointer moves on a screen (on graph display) in accordance with the movement of the mouse. In the graph display shown in FIG. 4, in a case where the user moves the mouse pointer to first component mounter WM31a, display section 42 executes the pop-up display shown in the upper stage in FIG. 6. In the pop-up display in the upper stage, switching timing TM1 of the production program, attachment or detachment timing TM2 of article 30, collation timing TM3 of article 30, and trial production time zone TZ3 are displayed for first component mounter WM31a.

It should be noted that attachment or detachment timing TM2 of article 30 includes detachment timing TM21 and attachment timing TM22. In addition, the reference numeral surrounded by squares indicates that the content of the setup changing work (for example, "switching of the production program" in a case of switching timing TM1 of the production program) is displayed. The above description of the display method can be similarly applied to the pop-up display described below. In addition, since first component mounter WM31a is component mounter WM3 on the foremost side (most upstream side) among multiple (ten) component mounters WM3, and first time zone TZ1 is shorter than other component mounters WM3, first time zone TZ1 is not displayed in the pop-up display in the upper stage.

In the graph display shown in FIG. 4, in a case where the user moves the mouse pointer to second component mounter WM32b, display section 42 executes the pop-up display of the lower stage shown in FIG. 6. In the pop-up display in the lower stage, switching timing TM1 of the production program, attachment or detachment timing TM2 of article 30, collation timing TM3 of article 30, first time zone TZ1, and trial production time zone TZ3 are displayed for second component mounter WM32b.

Similarly, in the graph display shown in FIG. 5, in a case where the user moves the mouse pointer to first component mounter WM31d, display section 42 executes the pop-up display shown in the upper stage in FIG. 7. In addition, in the graph display shown in FIG. 5, in a case where the user moves the mouse pointer to first component mounter WM31e, display section 42 executes the pop-up display shown in the lower stage in FIG. 7. The pop-up display shown in FIG. 7 is displayed in the same manner as the pop-up display shown in FIG. 6, but the display of first time zone TZ1 is omitted for convenience of illustration. In addition, in the pop-up display in the lower stage shown in FIG. 7, second time zone TZ2 is displayed.

As described above, the required time for the setup changing work in first component mounter WM31e shown in FIG. 5 is increased as compared with a case shown in FIG. 4. By confirming the pop-up display in the lower stage shown in FIG. 7, the user of operation state display device 40 can recognize that the problem of the setup changing work in first component mounter WM31e is caused by the trouble of board work machine WM0 (component mounter WM3).

It should be noted that the time from detachment timing TM21 to attachment timing TM22 is the required time for the attachment or detachment work of article 30. The required time for the attachment or detachment work of article 30 for first component mounter WM31d shown in the pop-up display in the upper stage of FIG. 7 and the required time for the attachment or detachment work of article 30 for first component mounter WM31e shown in the pop-up display in the lower stage of FIG. 7 are substantially the same. Therefore, in this case, the user of operation state display device 40 can recognize that, although the trouble of board work machine WM0 (component mounter WM3) has occurred, there is no problem in the attachment or detachment work itself of article 30.

In the graph display shown in FIG. 5, in a case where the user moves the mouse pointer to first component mounter WM31h, display section 42 executes the pop-up display shown in the upper stage in FIG. 8. In addition, in the graph display shown in FIG. 5, in a case where the user moves the mouse pointer to second component mounter WM32a, display section 42 executes the pop-up display shown in the lower stage in FIG. 8. The pop-up display shown in FIG. 8 is displayed in the same manner as the pop-up display shown in FIG. 7. It should be noted that, in FIG. 8, first time zone TZ1 is displayed, and in the pop-up display in the lower stage shown in FIG. 8, second time zone TZ2 is not displayed (trouble described above has not occurred).

The required time for the attachment or detachment work of article 30 for second component mounter WM32a shown in the pop-up display in the lower stage of FIG. 8 is rapidly increased as compared with first component mounter WM31h shown in the pop-up display in the upper stage of FIG. 8. As described above, the increase ratio of the required time for the setup changing work of second component mounter WM32a to first component mounter WM31h shown in FIG. 5 is rapidly increased as compared with component mounter WM3 from first component mounter WM31e to first component mounter WM31h. By confirming the pop-up display shown in FIG. 8, the user of operation state display device 40 can recognize that the problem of the setup changing work in second component mounter WM32a is caused by the required time for the attachment or detachment work of article 30.

In any mode described above, display section 42 can display scheduled time zone TS0 of the setup changing work and execution time zone TP0 in a comparable manner. Scheduled time zone TS0 can be calculated from the production program driving and controlling board work machine WM0. In this case, acquisition section 41 acquires scheduled time zone TS0 of the setup changing work calculated from the production program driving and controlling board work machine WM0.

Acquisition section 41 acquires difference information between article 30 used in the first production and article 30 used in the second production, for example, with reference to the production program used in the first production and the production program used in the second production. The difference information includes information relating to article 30 to be used only in the first production, article 30 to be used only in the second production, and article 30 to be used in both the first production and the second production, of which the mounting position is changed. Acquisition section 41 can calculate the scheduled required time for the attachment or detachment work based on the difference information. Similarly, acquisition section 41 can calculate the scheduled required time for another setup changing work, and can acquire scheduled time zone TS0 based on the calculated scheduled required time.

Display section 42 can display, for example, scheduled time zone TS0 of the setup changing work and execution time zone TP0 in an aligned manner in accordance with the start time. As a result, the user of operation state display device 40 can easily compare scheduled time zone TS0 of the setup changing work with execution time zone TP0. It should be noted that, in the graphical display shown in FIGS. 4 and 5, for convenience of illustration, scheduled time zone TS0 of the setup changing work and execution time zone TP0 are also shown for second component mounter WM32b. Similarly, display section 42 can display scheduled time zone TS0 of the setup changing work and execution time zone TP0 for other component mounters WM3 (board work machine WM0).

In addition, in any mode described above, display section 42 can display carry-in wait time TW1 and carry-out wait time TW2 together with execution time zone TP0 of target work machine TG0. Carry-in wait time TW1 refers to a wait time from when the setup changing work ends in target work machine TG0, which is one board work machine WM0 among multiple board work machines WM0, to when board 90 is carried in target work machine TG0 from board work machine WM0 on the upstream side of target work machine TG0. Carry-out wait time TW2 refers to a wait time from when the setup changing work ends in target work machine TG0 to when board 90 can be carried out to board work machine WM0 on the downstream side of target work machine TG0.

In this case, acquisition section 41 acquires carry-in wait time TW1 and carry-out wait time TW2 of target work machine TG0. Target work machine TG0 may be any board work machine WM0 among multiple board work machines WM0. In addition, target work machine TG0 may be any component mounter WM3 among multiple (ten) component mounters WM3. In the present embodiment, acquisition section 41 acquires carry-in wait time TW1 and carry-out wait time TW2 by using each of multiple (ten) component mounters WM3 as target work machine TG0.

Display section 42 can display carry-in wait time TW1 and carry-out wait time TW2 for each of multiple (ten) component mounters WM3. As a result, the user of operation state display device 40 can easily recognize carry-in wait time TW1 and carry-out wait time TW2. It should be noted that, in the graphical display shown in FIGS. 4 and 5, for convenience of illustration, carry-in wait time TW1 and carry-out wait time TW2 are displayed for second component mounter WM32b. Similarly, display section 42 can display carry-in wait time TW1 and carry-out wait time TW2 for other component mounters WM3 (board work machine WM0).

1-3-3. Determination Section 43

Determination section 43 determines that the setup changing work is appropriate in a case where an excess time obtained by subtracting the required time of the setup changing work in scheduled time zone TS0 from the required time of the setup changing work in execution time zone TP0 is shorter than a predetermined threshold value. In addition, in a case where the excess time is equal to or longer than the predetermined threshold value, determination section 43 determines that the setup changing work is inappropriate (step S12 shown in FIG. 3).

In the same manner as in the mode described above, acquisition section 41 acquires scheduled time zone TS0 of the setup changing work calculated from the production program driving and controlling board work machine WM0. In addition, the predetermined threshold value can be set, for example, to a time obtained by adding a predetermined ratio (for example, 10% to 50% of the required time) to the required time of the setup changing work in scheduled time zone TS0. Further, the predetermined threshold value can be set to, for example, a time obtained by adding a certain time to the required time zone of the setup changing work in scheduled time zone TS0.

In a mode in which operation state display device 40 includes determination section 43, display section 42 can display the appropriateness of the setup changing work determined by determination section 43. For example, in the graph display shown in FIG. 5, the excess time of the setup changing work in first component mounter WM31e and second component mounter WM32a is equal to or longer than the predetermined threshold value. In this case, determination section 43 determines that the setup changing work is inappropriate for first component mounter WM31e and second component mounter WM32a. In the graph display shown in FIG. 5, it is displayed that the setup changing work of first component mounter WM31e and second component mounter WM32a is inappropriate.

In addition, determination section 43 can select board work machine WM0 having the maximum excess time from among multiple board work machines WM0. In this case, in a case where execution time zone TP0 for each of multiple board work machines WM0 is graphically displayed, display section 42 can specify that board work machine WM0 selected by determination section 43 is a bottleneck.

For example, component mounter WM3 having the maximum excess time among multiple (ten) component mounters WM3 is second component mounter WM32a. In this case, determination section 43 selects second component mounter WM32a. Therefore, in a case where execution time zone TP0 for each of multiple (ten) component mounters WM3 is graphically displayed, display section 42 specifies that second component mounter WM32a selected by determination section 43 is the bottleneck. It should be noted that, as shown in FIG. 5, display section 42 can specify that second component mounter WM32a is the bottleneck by symbol CD0, or can specify the bottleneck by text information (bottleneck).

Further, determination section 43 can determine that stagnation period SP0 occurs in the setup changing work in a case where a predetermined condition is satisfied. The predetermined condition refers to that last board 90 of board product 900 to be produced in first production is carried out in board work machine WM0 on the rearmost side among multiple board work machines WM0, and then the predetermined number of initial boards 90 of board product 900 to be produced in the second production are carried in or carried out in board work machine WM0 on the foremost side among multiple board work machines WM0.

For example, the time when last board 90 of board product 900 produced in the first production is carried out in second component mounter WM32b on the rearmost side (most downstream side) among multiple (ten) component mounters WM3 is defined as time TK1. In addition, the time when the predetermined number of initial boards 90 of board product 900 produced in the second production are carried in or carried out in first component mounter WM31a on the foremost side (most upstream side) among multiple (ten) component mounters WM3 is defined as time TK2. In the graph display shown in FIG. 4, time TK2 arrives before time TK1. Therefore, in this case, the predetermined condition is not satisfied.

Figure 9:
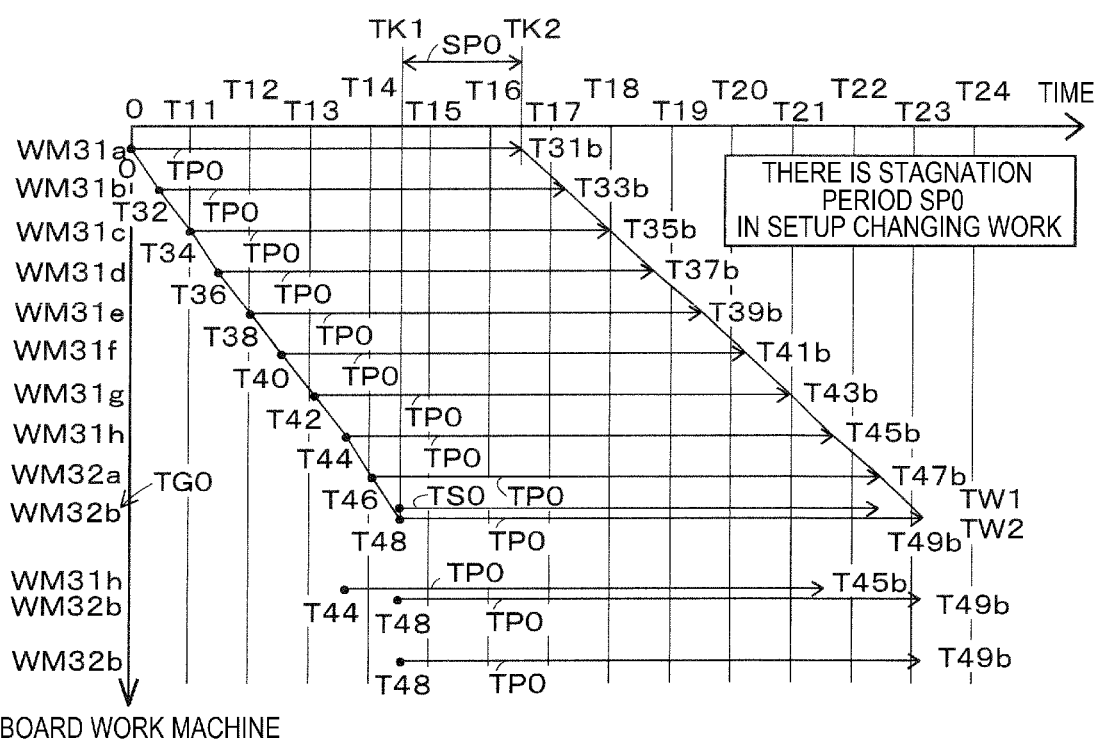
FIG. 9 is a schematic diagram showing still another example of the graph display by the display section.

FIG. 9 shows still another example of the graphical display by display section 42. FIG. 9 is shown in the same manner as FIG. 4. It should be noted that, in FIG. 9, time T31 displayed at the distal end portion of the arrow indicating execution time zone TP0 is indicated by time T31b, and time T33 is indicated by time T33b. Hereinafter, the same applies, and the end time of the setup changing work is made later than the end time shown in FIG. 4. Therefore, in the graph display shown in FIG. 9, time TK2 arrives after time TK1. Therefore, in this case, the predetermined condition is satisfied, and determination section 43 determines that stagnation period SP0 occurs in the setup changing work.

In this case, in a case where the execution time zone TP0 for each of multiple board work machines WM0 is graphically displayed, display section 42 specifies that stagnation period SP0 occurs in the setup changing work. That is, in a case where the execution time zone TP0 for each of multiple (ten) component mounters WM3 is graphically displayed, display section 42 specifies that stagnation period SP0 occurs in the setup changing work. It should be noted that, as shown in FIG. 9, display section 42 can display stagnation period SP0 of the setup changing work, and can also specify stagnation period SP0 in the setup changing work by the text information (there is stagnation period SP0 in the setup changing work).

2. Others

Operation states display device 40 can also include a suggestion section that suggests improving the setup changing work in a case where determination section 43 determines that the setup changing work is inappropriate. In this case, display section 42 can display suggestions made by the suggestion section. For example, as shown in the pop-up display in FIG. 6, detachment timing TM21 of article 30 in first component mounter WM31a on the foremost side (most upstream side) is later than the start time (time T48) of the setup changing work in second component mounter WM32b on the rearmost side (most downstream side). That is, in first component mounter WM31a, the start time of the attachment or detachment work of article 30 is extremely slow.

In this case, the suggestion section can suggest improving the attachment or detachment work of article 30 in first component mounter WM31a. For example, the suggestion section can suggest preparing article 30 to be used in the second production in advance. In addition, the suggestion section can also suggest verifying the work of the operator who has performed the attachment or detachment work of article 30 in first component mounter WM31a.

Further, for example, the required time for the attachment or detachment work of article 30 for second component mounter WM32a shown in the pop-up display in the lower stage of FIG. 8 is rapidly increased as compared with first component mounter WM31h shown in the pop-up display in the upper stage of FIG. 8. That is, in multiple (ten) component mounters WM3, the attachment or detachment work of article 30 is not leveled.

In this case, the suggestion section can suggest leveling the attachment or detachment work of article 30 in multiple (ten) component mounters WM3. For example, the suggestion section can suggest considering whether article 30 to be mounted in second component mounter WM32a cannot be mounted in second component mounter WM32b.

It should be noted that, in the present description, the setup changing work in component mounter WM3 is described, but the present disclosure is not limited to this. Display section 42 can display execution time zone TP0 of the setup changing work in various board work machines WM0. In addition, display section 42 can simultaneously display execution time zone TP0 of the setup changing work in multiple types of board work machines WM0. For example, display section 42 can simultaneously display execution time zone TP0 of the setup changing work in printer WM1, component mounter WM3, and reflow furnace WM5. Further, display section 42 can display various information relating to the setup changing work other than the specific information.

3. Operation State Display Method

The above description of operation state display device 40 can be similarly applied to the operation state display method. Specifically, the operation state display method includes an acquisition step and a display step. The acquisition step corresponds to the control performed by acquisition section 41. The display step corresponds to the control performed by display section 42. In addition, the operation state display method can include a determination step. The determination step corresponds to the control performed by determination section 43.

4. Example of Effects of Embodiments

Operation state display device 40 includes acquisition section 41 and display section 42. Therefore, operation state display device 40 can graphically display execution time zone TP0 in which the setup changing work of board production facility PF0 in which board product 900 is produced is performed in time series. The above description of operation state display device 40 can be similarly applied to the operation state display method.

REFERENCE SIGNS LIST

30: article, 40: operation state display device, 41: acquisition section, 42: display section, 43: determination section, 90: board, 900: board product, WM0: board work machine, TG0: target work machine, PF0: board production facility, TP0: execution time zone, TS0: scheduled time zone, TM1: switching timing, TM2: attachment or detachment timing, TM3: collation timing, TZ1: first time zone, TZ2: second time zone, TZ3: trial production time zone, TW1: carry-in wait time, TW2: carry-out wait time, SP0: stagnation period

The invention claimed is:

1. An operation state display device configured to display an operation state of a board production facility in which a board is sequentially conveyed to multiple board work machines, which are configured to perform predetermined board work on the board, and the board work is sequentially performed to produce a board product, the device comprising:
    an processor configured to acquire an execution time zone in which setup changing work required for switching a type of the board product to be produced is performed, for each board work machine, based on production information acquired by the board production facility during production of the board product; and
    a display section configured to graphically display at least one of the execution time zone for each of the multiple board work machines and the execution time zone for a predetermined board work machine of the board production facility in time series,
    wherein the processor is configured to acquire, as the execution time zone, a time zone from a time when a last board of the board product to be produced in first production before the type of the board product is switched is carried out to a time when a predetermined number of initial boards of the board product to be produced in second production after the type of the board product is switched are carried in or carried out.

2. The operation state display device according to claim 1, wherein the production information includes specific information, which is information relating to at least one of a switching timing of a production program that drives and controls the board work machine, an attachment or detachment timing of an article attached to or detached from the board work machine, a collation timing of the article at which correctness of the article mounted on the board work machine is determined, a first time zone from when collation of the article is completed to when the board is carried in the board work machine, a second time zone from when the board work machine is stopped due to a failure of the setup changing work to when the board work machine is operatable, and a trial production time zone in which trial production of the board product is performed in the setup changing work, and
the display section is configured to display the specific information together with the execution time zone.

3. The operation state display device according to claim 2, wherein the display device is configured to execute pop-up display of a predetermined execution time zone selected by a user and the specific information relating to the execution time zone.

4. The operation state display device according to claim 1, wherein the processor is configured to acquire a scheduled time zone of the setup changing work calculated from a production program that drives and controls the board work machine, and
the display section is configured to display the scheduled time zone and the execution time zone in a comparable manner.

5. The operation state display device according to claim 1, wherein the processor is configured to acquire a carry-in wait time from when the setup changing work ends in a target work machine, which is one board work machine among the multiple board work machines, to when the board is carried in the target work machine from the board work machine on an upstream side of the target work machine, and a carry-out wait time from when the setup changing work ends in the target work machine to when the board is carried out to the board work machine on a downstream side of the target work machine, and
the display device is configured to display the carry-in wait time and the carry-out wait time together with the execution time zone of the target work machine.

6. The operation state display device according to claim 1, wherein the processor is configured to
    acquire a scheduled time zone of the setup changing work calculated from a production program that drives and controls the board work machine,
    determine that the setup changing work is appropriate in a case where an excess time obtained by subtracting a required time of the setup changing work in the scheduled time zone from a required time of the setup changing work in the execution time zone is shorter than a predetermined threshold value, and
    determine that the setup changing work is inappropriate in a case where the excess time is equal to or longer than the predetermined threshold value,
wherein the display device is configured to display appropriateness of the setup changing work determined by the determination section,
wherein the processor is configured to determine that a stagnation period occurs in the setup changing work in a case where a last board of the board product to be produced in first production before the type of the board product is switched is carried out in the board work machine on a rearmost side among the multiple board work machines, and then a predetermined number of initial boards of the board product to be produced in second production after the type of the board product is switched are carried in or carried out in the board work machine on a foremost side among the multiple board work machines, and
the display device is configured to specify that the stagnation period occurs in the setup changing work in a case where the execution time zone for each of the multiple board work machines is graphically displayed.

7. An operation state display method of displaying an operation state of a board production facility in which a board is sequentially conveyed to multiple board work machines, which are configured to perform predetermined board work on the board, and the board work is sequentially performed to produce a board product, the method comprising:
- an acquisition step of acquiring an execution time zone in which setup changing work required for switching a type of the board product to be produced is performed, for each board work machine, based on production information acquired by the board production facility during production of the board product; and
- a display step of graphically displaying at least one of the execution time zone for each of the multiple board work machines and the execution time zone for a predetermined board work machine of the board production facility in time series,
- wherein the acquisition step includes acquiring, as the execution time zone, a time zone from a time when a last board of the board product to be produced in first production before the type of the board product is switched is carried out to a time when a predetermined number of initial boards of the board product to be produced in second production after the type of the board product is switched are carried in or carried out.

* * * * *